(12) United States Patent
Chiu

(10) Patent No.: US 11,011,468 B2
(45) Date of Patent: May 18, 2021

(54) SEMICONDUCTOR STRUCTURE AND METHOD FOR MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/676,291

(22) Filed: Nov. 6, 2019

(65) Prior Publication Data
US 2020/0111743 A1 Apr. 9, 2020

Related U.S. Application Data

(62) Division of application No. 16/153,073, filed on Oct. 5, 2018, now Pat. No. 10,522,466.

(51) Int. Cl.
*H01L 23/528* (2006.01)
*H01L 23/48* (2006.01)
(Continued)

(52) U.S. Cl.
CPC ........ *H01L 23/5286* (2013.01); *H01L 21/283* (2013.01); *H01L 21/304* (2013.01); *H01L 21/6835* (2013.01); *H01L 21/7684* (2013.01); *H01L 21/76859* (2013.01); *H01L 21/76895* (2013.01); *H01L 21/76898* (2013.01); *H01L 23/481* (2013.01); *H01L 23/4824* (2013.01); *H01L 23/5386* (2013.01); *H01L 2221/68372* (2013.01)

(58) Field of Classification Search
CPC ...................... H01L 23/4824; H01L 21/76895
See application file for complete search history.

(56) References Cited

U.S. PATENT DOCUMENTS

2011/0284954 A1* 11/2011 Hsieh ................. H01L 29/7806
257/331
2014/0210058 A1 7/2014 Lee
(Continued)

FOREIGN PATENT DOCUMENTS

| CN | 101083227 A | 12/2007 |
| CN | 102769004 A | 11/2012 |
| TW | 201246479 A | 11/2012 |

*Primary Examiner* — Farun Lu
(74) *Attorney, Agent, or Firm* — Muncy, Geissler, Olds & Lowe, P.C.

(57) ABSTRACT

The present disclosure provides a semiconductor structure. The semiconductor structure includes a semiconductor substrate, a target layer, a plurality of metal pads, a plurality of conductive lines, a plurality of conductive plugs, an isolating liner, and a plurality of metal contacts. The semiconductor substrate has a front surface, a rear surface opposite to the front surface, and an implanted region connected to the rear surface. The target layer is disposed over the front surface. The metal pads are disposed over the target layer. The plurality of conductive lines are disposed within the semiconductor substrate and the target layer and connected to the metal pads. The conductive plugs are disposed in the implanted region. The isolating liner encircles the conductive plugs. The metal contacts are disposed over the conductive lines and the conductive plugs.

9 Claims, 10 Drawing Sheets

(51) Int. Cl.
*H01L 23/482* (2006.01)
*H01L 21/768* (2006.01)
*H01L 21/683* (2006.01)
*H01L 21/304* (2006.01)
*H01L 21/283* (2006.01)
*H01L 23/538* (2006.01)

(56) References Cited

U.S. PATENT DOCUMENTS

2017/0069726 A1\* 3/2017 Kye .................. H01L 27/10894
2017/0200675 A1\* 7/2017 Jung .................... H01L 23/485

\* cited by examiner

SEMICONDUCTOR STRUCTURE AND METHOD FOR MANUFACTURING THE SAME

CROSS-REFERENCE TO RELATED APPLICATION

This application is a divisional application of U.S. Non-Provisional application Ser. No. 16/153,073 filed Oct. 5, 2018, which is incorporated herein by reference in its entirety.

TECHNICAL FIELD

The present disclosure relates to a semiconductor structure and a method for manufacturing the same, and more particularly, to a semiconductor structure having a completely grounded substrate and a method for manufacturing the same.

DISCUSSION OF THE BACKGROUND

Complementary metal-oxide-semiconductor (CMOS) components are well-known and widely used since CMOS components have advantages, such as lower power consumption and higher noise immunity over a wide range of power supply voltages, compared to other MOS technologies.

The CMOS components at least include a substrate, an n-channel transistor, a p-channel transistor, and a p-type region, wherein the n-channel transistor, the p-channel transistor, and the p-type region are formed on the substrate. Grounding means are used for coupling the p-type region to a predetermined potential such as ground potential.

In general, the p-type region for grounding is formed on the front side of the substrate. The depth of penetration of the implanted ions in the p-type region is limited by the implant energy; as a result, the p-type region has a shallow depth compared to the whole substrate, resulting in poor grounding effect and therefore a poor electrical performance of the CMOS components.

Accordingly, it is desirable to ensure the substrate is completely grounded to improve the electrical performance.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a semiconductor substrate, a target layer, a plurality of metal pads, a plurality of conductive lines, a plurality of conductive plugs, an isolating liner, and a plurality of metal contacts. The semiconductor substrate has a front surface, a rear surface opposite to the front surface, and an implanted region connected to the rear surface. The target layer is disposed over the front surface. The plurality of metal pads are disposed over the target layer. The plurality of conductive lines are disposed within the semiconductor substrate and the target layer and connected to the metal pads. The plurality of conductive plugs are disposed in the implanted region. The isolating liner encircles the conductive plugs. The plurality of metal contacts are disposed over the conductive lines and the conductive plugs.

In some embodiments, the conductive lines and the conductive plugs are arranged in a staggered configuration.

In some embodiments, the metal pads are equally spaced from each other.

In some embodiments, the isolating liner encircling the conductive plugs is disposed in the implanted region.

In some embodiments, the isolating liner is further disposed over the rear surface.

In some embodiments, the semiconductor substrate is a p-type substrate, and a dopant implanted in the implanted region is a p+ type dopant.

In some embodiments, the implanted region includes boron ions.

In some embodiments, the implanted region is positioned at a center of the semiconductor substrate.

In some embodiments, the metal pads are electrically connected to the metal contacts through the conductive lines.

In some embodiments, a material of the conductive lines is the same as a material of the conductive plugs.

Another aspect of the present disclosure provides a method for manufacturing a semiconductor structure. The method includes steps of providing a semiconductor substrate; depositing a target layer over a front surface of the semiconductor substrate; forming a plurality of metal pads over the target layer; implanting ions through a rear surface opposite to the front surface to form an implanted region; forming a plurality of trenches in the implanted region and a plurality of through-holes through the semiconductor substrate and the target layer to expose the metal pads; depositing a first conductive material in the through-holes; depositing an isolating liner in the trenches; etching the isolating liner to expose a first wall of the implanted region and the first conductive material; depositing a second conductive material in the trenches; and forming a plurality of metal contacts over the first conductive material and the second conductive material.

In some embodiments, the metal pads are electrically connected to the metal contacts through the first conductive material.

In some embodiments, the first conductive material has a thickness sufficient to fill the through-holes, and the second conductive material has another thickness sufficient to fill the trenches.

In some embodiments, the method further includes a step of performing planarizing processes to remove excess portions of the first conductive material and the second conductive material.

In some embodiments, the method further includes steps of providing a carrier and an adhesive layer disposed over the carrier; flipping the semiconductor substrate with the target layer and the metal pads upside down before the forming of the implanted region, so that the metal pads face the adhesive layer and are in contact with the adhesive layer; and removing the carrier and the adhesive layer after the forming of the metal contacts.

In some embodiments, the metal pads are buried in the adhesive layer.

In some embodiments, the method further includes a step of performing a grinding treatment on a back surface of the semiconductor substrate until the rear surface is exposed.

In some embodiments, the implanted region is connected to the rear surface.

In some embodiments, the through-holes and the trenches are arranged in a staggered configuration.

In some embodiments, the implanted region is formed by implanted boron ions through the rear surface.

With the above-mentioned configurations of semiconductor structure, substrate grounding is improved, thereby improving the electrical performance characteristics. Consequently, the disadvantage of the conventional CMOS components can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
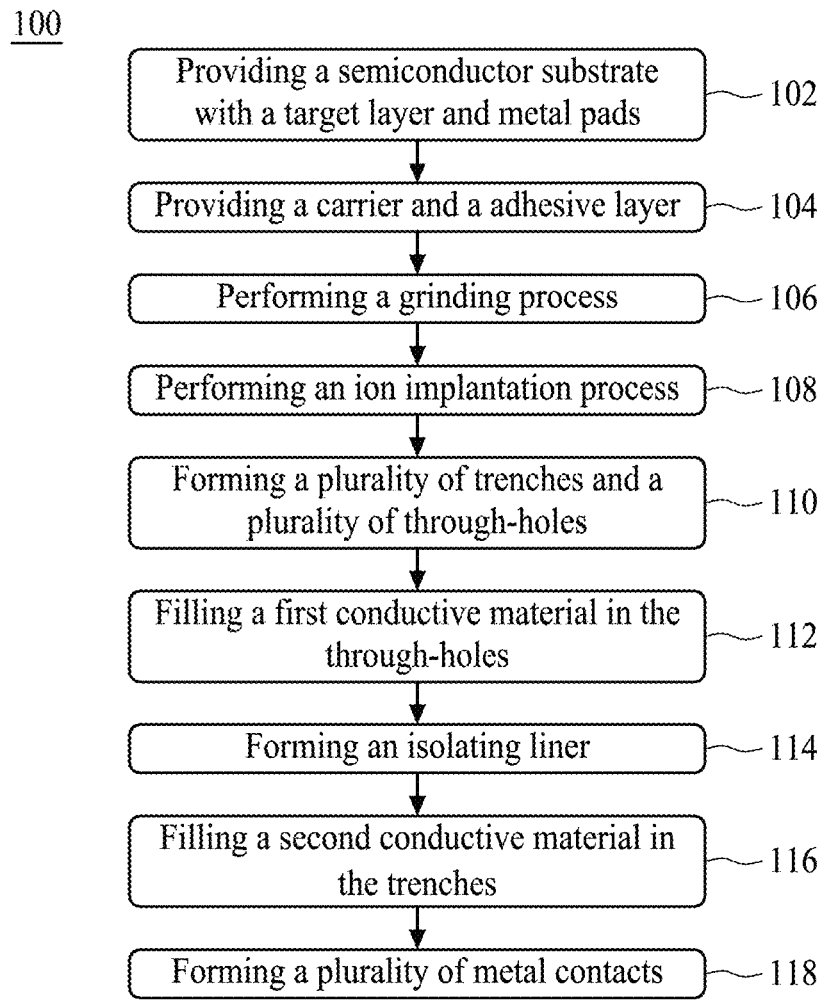
FIG. 1 is a flow diagram illustrating a method for manufacturing silicon structures, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method 100 for manufacturing silicon structures, in accordance with some embodiments of the present disclosure. FIGS. 2 through 10 illustrate cross-sectional views of intermediate stages in the formation of a semiconductor structure 300 in accordance with some embodiments of the present disclosure. The steps shown in FIGS. 2 through 10 are also illustrated schematically in the process flow shown in FIG. 1. In the subsequent discussion, the process steps shown in FIGS. 2 through 10 are discussed in reference to the process steps in FIG. 1.

Figure 2:
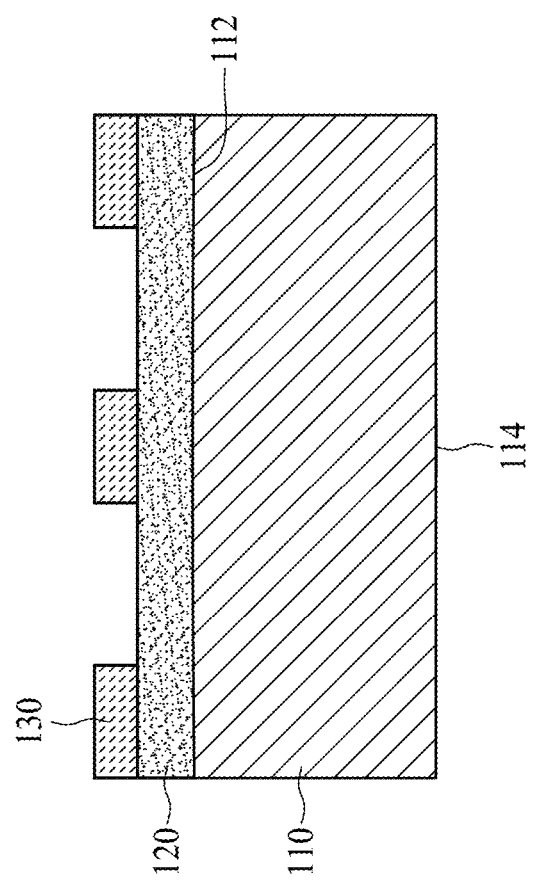
FIGS. 2 through 10 illustrate cross-sectional views of intermediate stages in the formation of a semiconductor structure in accordance with some embodiments of the present disclosure.

Referring to FIG. 2, a target layer 120 is provided over a semiconductor substrate 110, and a plurality of metal pads 130 are provided over the target layer 120 according to a step 102 shown in FIG. 1. The semiconductor substrate 110 has a front surface 112 and a back surface 114 opposite to the front surface 112, and the target layer 120 is formed over the front surface 112.

In some embodiments, the semiconductor substrate 110 is a bulk silicon substrate. In some embodiments, the semiconductor substrate 110 comprises an elementary semiconductor, such as silicon or germanium in a crystalline structure. In some embodiments, the semiconductor substrate 110 is a p-type substrate. In some embodiments, the target layer 120 has a single-layered structure or a multi-layered structure including various conductive materials and/or insulating materials. In some embodiments, the metal pads 130 are equally spaced from each other. In some embodiments, the metal pads 130 are formed of copper or aluminum.

Figure 3:
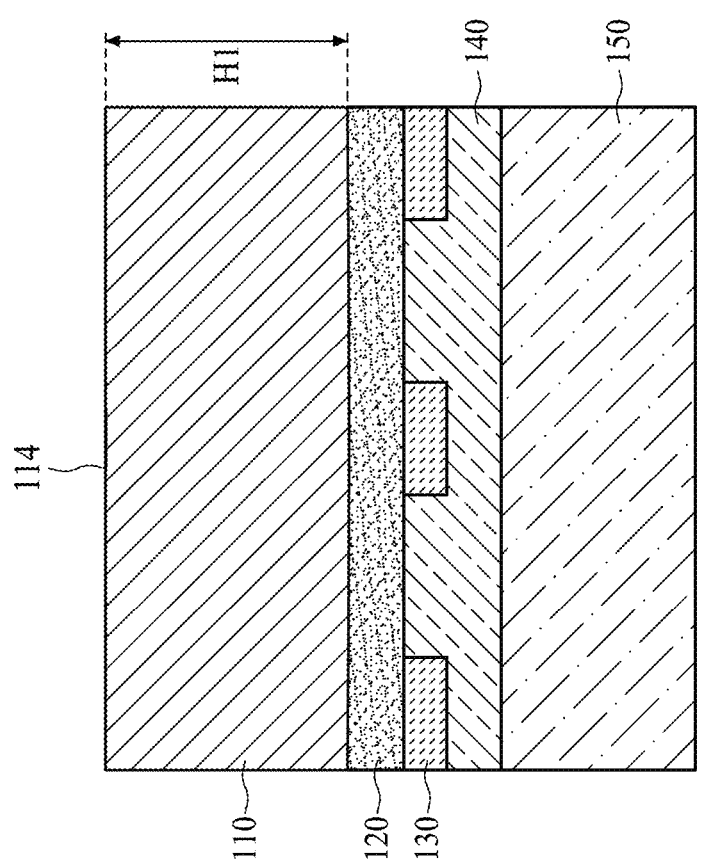

Referring to FIG. 3, in some embodiments, an adhesive layer 140 and a carrier 150 are provided according to a step 104 shown in FIG. 1, wherein the adhesive layer 140 is disposed over the carrier 150. In some embodiments, the semiconductor substrate 110 with the target layer 120 and the metal pads 130 shown in FIG. 2 is flipped upside down, so that the metal pads 130 face down and are in contact with the adhesive layer 220. In some embodiments, the target layer 120 is in contact with the adhesive layer 140, and the metal pads 130 are buried in the adhesive layer 140. In some embodiments, the adhesive layer 140 can be decomposed when exposed to heat or light, and hence the adhesive layer 140 can release the carrier 150 from the metal pads 130 (and the target layer 120). In some embodiments, the carrier 150 is a blank glass carrier, a blank ceramic carrier, or the like, and has a round shape when viewed from above.

Figure 4:
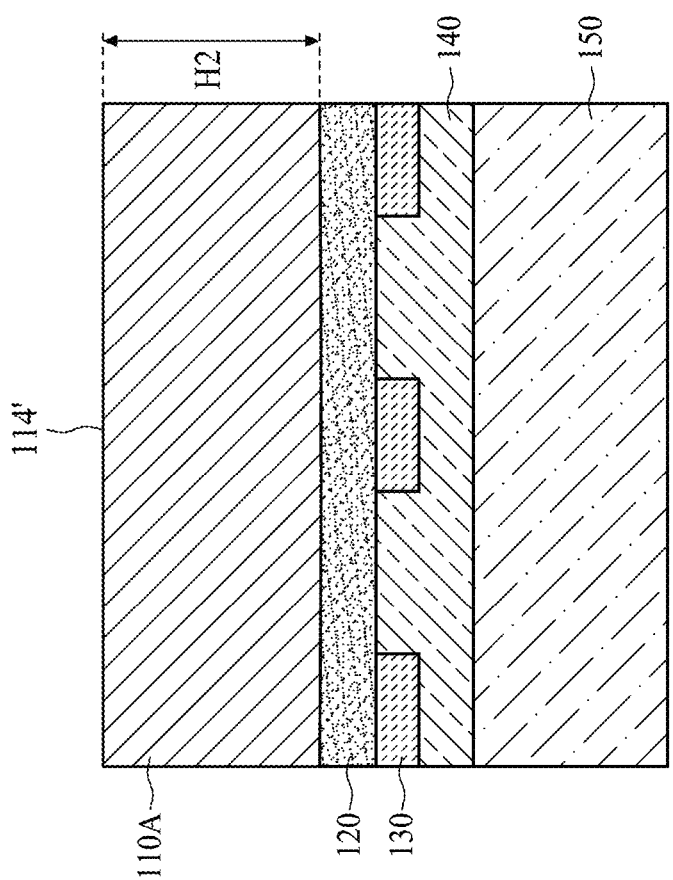

Referring to FIG. 4, in some embodiments, a grinding (cutting or polishing) treatment is performed to reduce the size of the semiconductor substrate 110 according to a step 106 shown in FIG. 1. In some embodiments, the grinding treatment is performed on the back surface 114 of the semiconductor substrate 110. In some embodiments, a height H2 from the front surface 112 to a rear surface 114' of the ground semiconductor substrate 110A shown in FIG. 4 is less than a height H1 from the front surface 112 to the back surface 114 of the semiconductor substrate 110 shown in FIG. 3.

Figure 5:
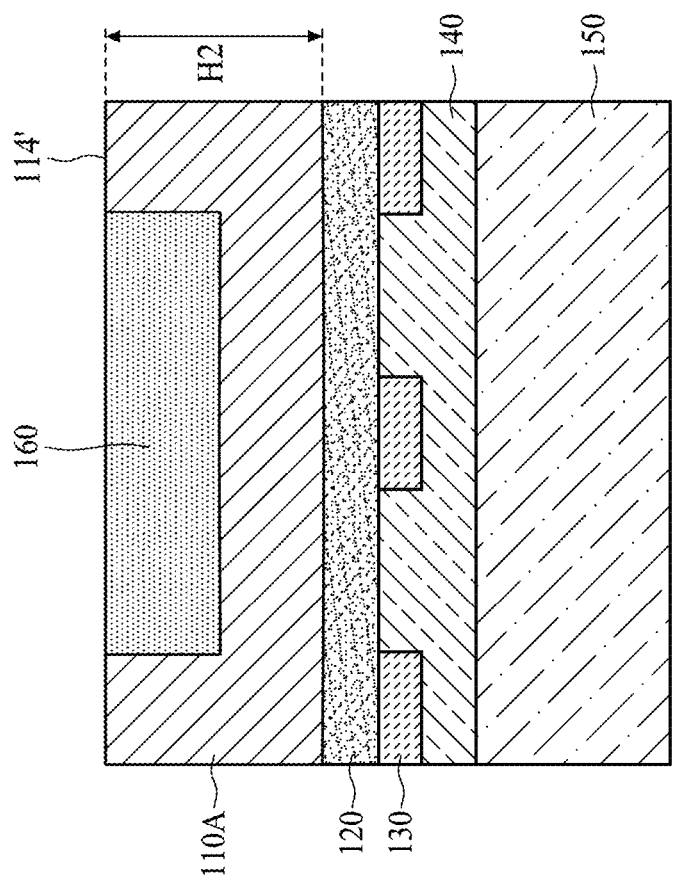

Referring to FIG. 5, in some embodiments, an ion implantation process is performed to allow a dopant penetrating the rear surface 114' to form an implanted region 160 according to a step 108 shown in FIG. 1. In some embodiments, the dopant implanted in the implanted region 160 is a p+ type dopant. In some embodiments, the implanted region 160 is connected to the rear surface 114' of the semiconductor substrate 110A. In some embodiments, the implanted region 160 is formed by implanting boron ions through the rear surface 114'. In some embodiments, the implanted region 160 is positioned at a center of the semiconductor substrate 110.

Figure 6:
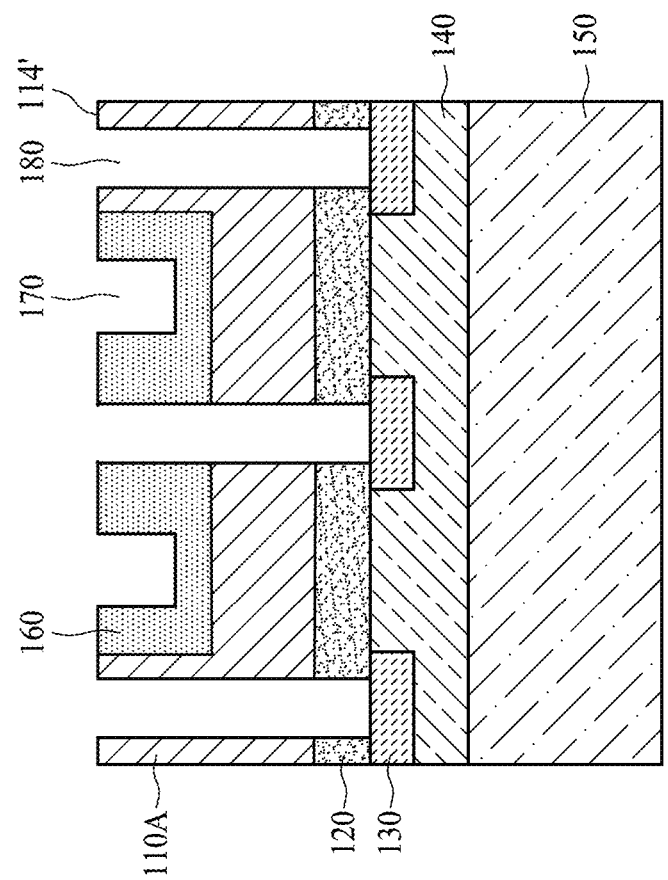

Referring to FIG. 6, in some embodiments, a plurality of trenches 170 are formed in the implanted region 160 and a plurality of through-holes 180 are formed through the semiconductor substrate 110 and the target layer 120 to expose the metal pads 130 according to a step 110 shown in FIG. 1. In some embodiments, the trenches 170 and the through-holes 180 are arranged in a staggered configuration. In some embodiments, the trenches 170 and the through-holes 180 are formed by different processes. In some embodiments, the trenches 170 are formed by any suitable process, such as photolithography and etching processes. In some embodiments, the trenches 170 are formed by exposing a photoresist layer to a pattern and developing the photoresist layer to form a patterned mask; the patterned mask is then used in an etching process to etch the trenches 170 into the semiconductor substrate 110A. The etching process uses the patterned mask to define the area to be etched and to protect other regions of the semiconductor substrate 110A. In some embodiments, the etching process includes a wet etching process, a dry etching process, or a combination thereof. In some embodiments, the through-holes 180 are formed by a laser drilling process, a deep reactive-ion etching (DRIE) process, or a wet etching process.

Figure 7:
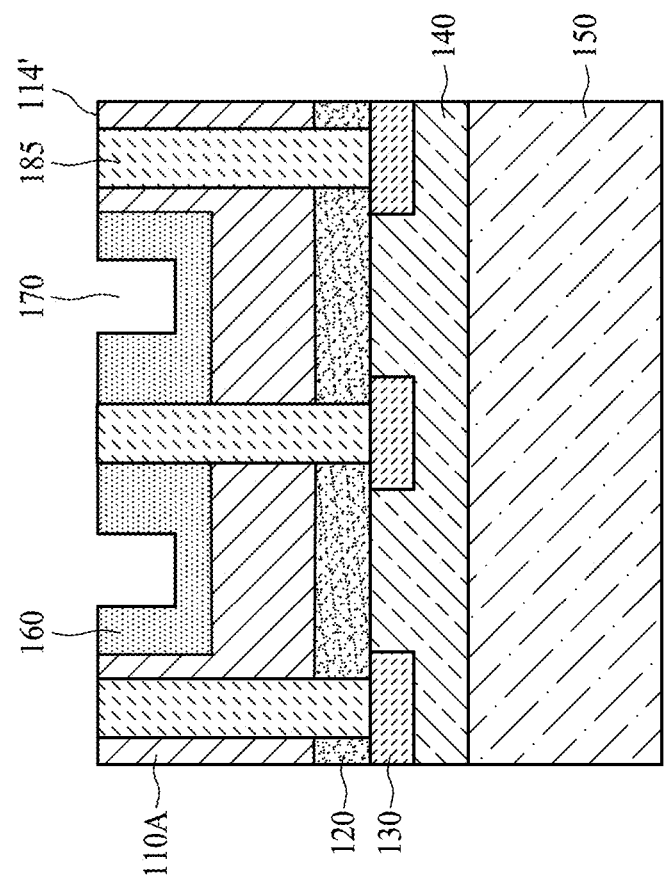

Referring to FIG. 7 in some embodiments, the through-holes 180 are filled with a first conductive material to form a plurality of conductive lines 185 according to a step 112 shown in FIG. 1. In some embodiments, the first conductive material has a thickness sufficient to fill the through-holes 180. In some embodiments, a planarizing process is performed on the semiconductor structure to remove excess portions of the first conductive material. In some embodiments, the planarizing process includes a chemical mechanical polishing (CMP) process. In some embodiments, the first conductive material over the rear surface 114' is planarized using the CMP process. In some embodiments, the first conductive material includes copper. In some embodiments, the first conductive material includes tungsten.

Figure 8:
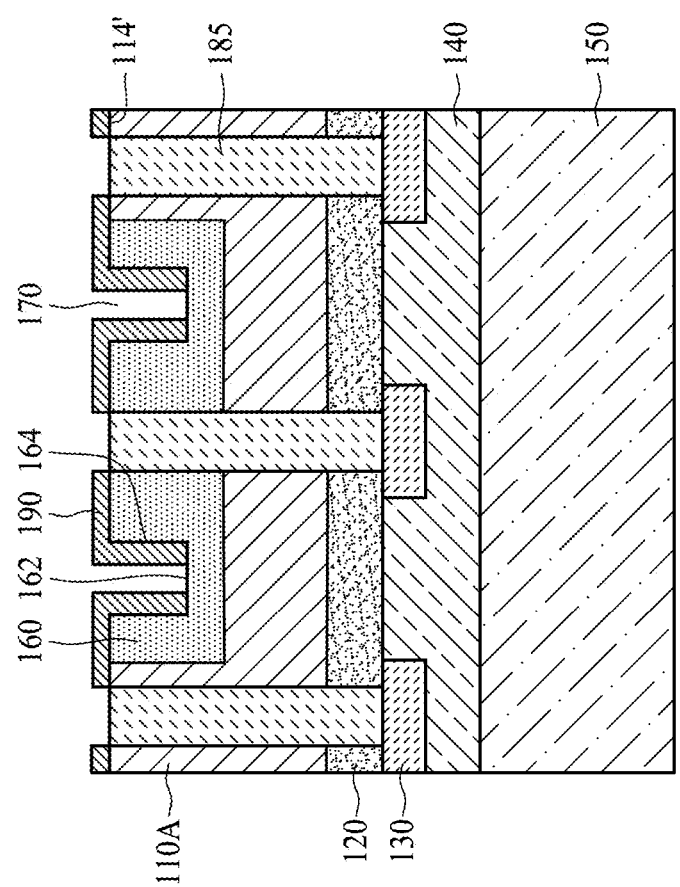

Referring to FIG. 8, in some embodiments, an isolating liner 190 is formed over the rear surface 114', over the conductive lines 185 and in the trenches 170 according to a step 114 shown in FIG. 1, and an etching process is then used to etch portions of the isolating liner 190 to expose the first walls 162 of the implanted region 160 and the conductive lines 185. In some embodiments, the etching process that is used to etch the portions of the isolating lines 190 includes a wet etching process, a dry etching process, or a combination thereof. In some embodiments, the dry etching process may include forming a photoresist layer over the isolating liner 190, patterning the photoresist layer, etching the portions of the isolating liner 190, and removing the photoresist layer. In some embodiments, the isolating liner 190 is disposed over the rear surface 114' and second walls 164 of the implanted region 160, wherein the second wall 164 is adjacent to the first wall 162. In some embodiments, a thickness of the isolating liner 190 disposed over the rear surface 114' is substantially the same as a thickness of the isolating liner 190 disposed over the second walls 164. In some embodiments, the isolating liner 190 is made of a dielectric material. In some embodiments, the isolating liner 190 includes oxide. In some embodiments, the isolating liner 190 includes silicon oxide.

Figure 9:
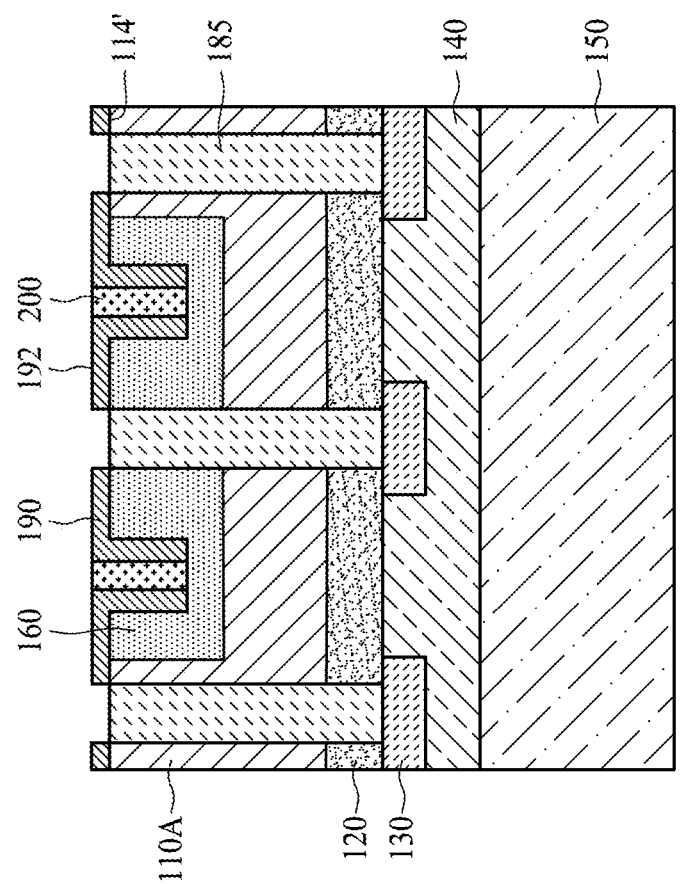

Referring to FIG. 9, in some embodiments, the trenches 170 surrounded by the isolating liner 190 are filled with a second conductive material to form a plurality of conductive plugs 200 according to a step 116 shown in FIG. 1. In some embodiments, the second conductive material has a thickness sufficient to fill the trenches 170. In some embodiments, a planarizing process is performed on the semiconductor structure to remove excess portions of the second conductive material. In some embodiments, the planarizing process includes a CMP process. In some embodiments, the second conductive material formed over a front surface 192, away from the rear surface 114', is planarized using the CMP process. In some embodiments, the conductive plugs 200 are in contact with the implanted region 160 through the first walls 162. In some embodiments, a material of the second conductive material is the same as that of the first conductive material. In some embodiments, the second conductive material includes tungsten.

Figure 10:
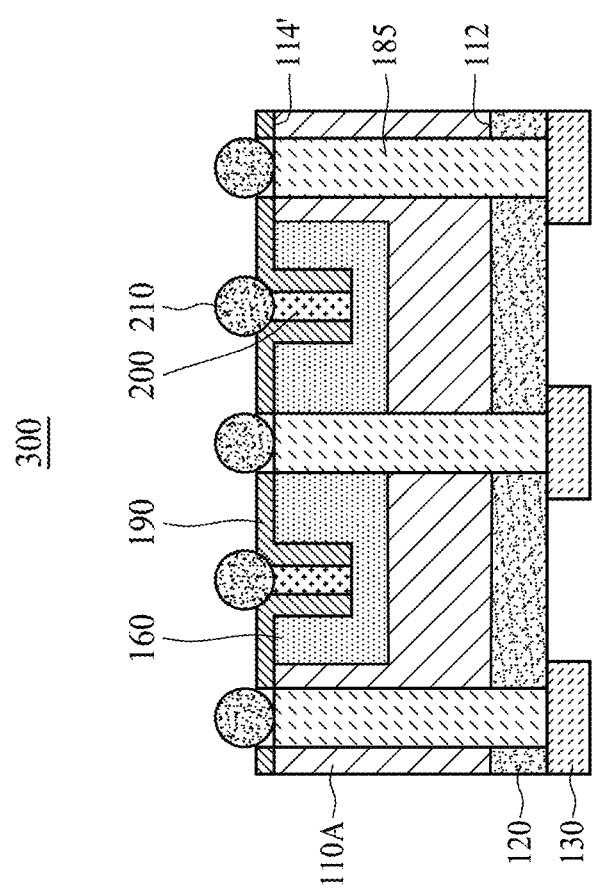

Referring to FIG. 10, in some embodiments, a plurality of metal contacts 210 are formed over the conductive lines 185 and the conductive plugs 200 according to a step 118 shown in FIG. 1. In some embodiments, the metal contacts 210 have a circular cross section. In some embodiments, the metal contacts 210 are in the form of solder balls. In some embodiments, the metal contacts 210 are electrically connected to the metal pads 130 through the conductive lines 185. In some embodiments, the metal contacts 210 are made of copper or copper alloy. In some embodiments, the copper alloy includes copper, palladium, and gold.

Next, the carrier 150 is removed to form the semiconductor structure 300. In some embodiments, the carrier 150 is removed from the metal pads 130 (and the target layer 120) such that the metal pads 130 (and the target layer 120) are released from the carrier 150. In some embodiments, the semiconductor structure is flipped prior to or after removal of the carrier 150. In some embodiments, the carrier 150 is reusable such that the carrier 150 can be used again after removal. In some embodiments, the carrier 150 can be used again.

As illustrated FIG. 10, in some embodiments, the semiconductor structure 300 of the present disclosure includes a semiconductor substrate 110A, a target layer 120, a plurality of metal pads 130, a plurality of conductive lines 185, an isolating liner 190, a plurality of conductive plugs 200, and a plurality of metal contacts 210. In some embodiments, the semiconductor substrate 110A has a front surface 112, a rear surface 114' opposite to the front surface 112, and an implanted region 160 connected to the rear surface 114'. In some embodiments, the target layer 120 is disposed over the front surface 112, and the metal pads 130 are disposed over the target surface 120. In some embodiments, the conductive lines are disposed within the semiconductor substrate 110 and the target layer 120 and connected to the metal pads 130, respectively. In some embodiments, the conductive plugs 200 are disposed in the implanted region 160 and surrounded by the isolating liner 190. In some embodiments, the metal contacts 210 are disposed over the conductive lines 185 and the conductive plugs 200.

In some embodiments, the semiconductor substrate 110 is a p-type substrate, and a dopant implanted in the implanted region 160 is a p+ type dopant. In some embodiments, the implanted region 160 includes boron ions. In some embodiments, the metal pads 130 are equally spaced from each other. In some embodiments, the conductive lines 185 and the conductive plugs 200 are arranged in a staggered configuration. In some embodiments, a material of the conductive lines 185 is the same as a material of the conductive plugs 200. In some embodiments, the isolating liner 190 encircling the conductive plug 200 is disposed in the implanted region 160. In some embodiments, the isolating liner 190 is further disposed over the rear surface 114'. In some embodiments, the metal pads 130 are electrically connected to the metal contacts 210 through the conductive lines 185.

In conclusion, with the configuration of the semiconductor structure 300 of the present disclosure, the semiconductor substrate 110A of the present disclosure can be completely grounded by the conductive lines 185 penetrating the semiconductor substrate 110A and the target layer 120. As a result, substrate grounding is improved, thereby improving the electrical performance characteristics.

One aspect of the present disclosure provides a semiconductor structure. In some embodiments, the semiconductor structure includes a semiconductor substrate, a target layer, a plurality of metal pads, a plurality of conductive lines, a plurality of conductive plugs, an isolating liner, and a plurality of metal contacts. In some embodiments, the semiconductor substrate has a front surface, a rear surface opposite to the front surface, and an implanted region connected to the rear surface. In some embodiments, the target layer is disposed over the front surface. In some embodiments, the plurality of metal pads are disposed over the target layer. In some embodiments, the plurality of conductive lines are disposed within the semiconductor substrate and the target layer and connected to the metal pads. In some embodiments, the plurality of conductive plugs are disposed in the implanted region. In some embodiments, the isolating liner encircles the conductive plugs. In some embodiments, the plurality of metal contacts are disposed over the conductive lines and the conductive plugs.

One aspect of the present disclosure provides a method for manufacturing the semiconductor structure. The method includes steps of providing a semiconductor substrate; depositing a target layer over a front surface of the semiconductor substrate; forming a plurality of metal pads over the target layer; implanting ions through a rear surface opposite to the front surface to form an implanted region in the semiconductor substrate; forming a plurality of trenches in the implanted region and a plurality of through-holes through the semiconductor substrate and the target layer to expose the metal pads; depositing a first conductive material in the through-holes; depositing an isolating liner in the trenches; etching back the isolating liner to expose a first wall of the implanted region and the first conductive material; disposing a second conductive material in the trenches; and forming a plurality of metal contacts over the first conductive material and the second conductive material.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   a semiconductor substrate having a front surface, a rear surface opposite to the front surface, and an implanted region connected to the rear surface;
   a target layer disposed over the front surface;
   a plurality of metal pads disposed over the target layer;
   a plurality of conductive lines disposed within the semiconductor substrate and the target layer, wherein the plurality of conductive lines are connected to the metal pads;
   a plurality of conductive plugs disposed in the implanted region;
   an isolating liner encircling the conductive plugs; and
   a plurality of metal contacts disposed over the conductive lines and the conductive plugs;
   wherein the isolating liner encircling the conductive plugs is disposed in the implanted region.

2. The semiconductor structure of claim 1, wherein the conductive lines and the conductive plugs are arranged in a staggered configuration.

3. The semiconductor structure of claim 1, wherein the metal pads are equally spaced from each other.

4. The semiconductor structure of claim 1, wherein the isolating liner is further disposed over the rear surface.

5. The semiconductor structure of claim 1, wherein the semiconductor substrate is a p-type substrate, and a dopant implanted in the implanted region is a p+ type dopant.

6. The semiconductor structure of claim 1, wherein the implanted region comprises boron ions.

7. The semiconductor structure of claim 1, wherein the implanted region is positioned at a center of the semiconductor substrate.

8. The semiconductor structure of claim 1, wherein the metal pads are electrically connected to the metal contacts through the conductive lines.

9. The semiconductor structure of claim 1, wherein a material of the conductive lines is the same as a material of the conductive plugs.

* * * * *